United States Patent
Braun

(10) Patent No.: US 10,718,823 B2
(45) Date of Patent: Jul. 21, 2020

(54) OPEN LOAD DIAGNOSIS

(71) Applicant: RENESAS ELECTRONICS CORPORATION, Tokyo (JP)

(72) Inventor: Hans-Juergen Braun, Duesseldorf (DE)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 39 days.

(21) Appl. No.: 16/318,876

(22) PCT Filed: Jul. 21, 2016

(86) PCT No.: PCT/EP2016/067463
§ 371 (c)(1),
(2) Date: Jan. 18, 2019

(87) PCT Pub. No.: WO2018/014965
PCT Pub. Date: Jan. 25, 2018

(65) Prior Publication Data
US 2019/0285685 A1    Sep. 19, 2019

(51) Int. Cl.
*G01R 31/50* (2020.01)
*G01R 27/16* (2006.01)
*G01R 31/66* (2020.01)

(52) U.S. Cl.
CPC .............. *G01R 31/50* (2020.01); *G01R 27/16* (2013.01); *G01R 31/66* (2020.01)

(58) Field of Classification Search
CPC ........ G01R 31/50; G01R 31/66; G01R 27/16; G01R 31/2824; H03L 7/085; H03L 7/093; H03L 7/18
See application file for complete search history.

(56) References Cited

U.S. PATENT DOCUMENTS 5,250,909 A * 10/1993 Bitts .................. G01R 31/2836
324/503
5,491,424 A * 2/1996 Asar .................... G01R 27/205
324/715
5,532,601 A * 7/1996 Weir ...................... G01R 31/54
324/539

(Continued)

FOREIGN PATENT DOCUMENTS

DE    102007059365 A1    12/2008

OTHER PUBLICATIONS

International Search Report and Written Opinion of PCT/EP2016/067463 dated Mar. 30, 2017.

*Primary Examiner* — Jermele M Hollington
*Assistant Examiner* — Taqi R Nasir
(74) *Attorney, Agent, or Firm* — Burr & Forman, LLP

(57) ABSTRACT

A device for open load diagnosis of a signal line in a digital system in which a logic state is represented by a band of voltages lying between first and second voltage limits is described. The device is configured to cause the signal line to reach a first, stable voltage lying in the band, to apply a second, different voltage to the signal line lying in the band and without leaving the band, to perform a time constant dependent measurement so as to determine a value of a parameter which is or depends on resistance of a load between the signal line and a reference line, to compare the value of the parameter with a reference value of the parameter and, in dependence on comparison, to signal the result.

18 Claims, 8 Drawing Sheets

(56) References Cited

U.S. PATENT DOCUMENTS

| | | |
|---|---|---|
| 8,489,781 B1 | 7/2013 | An et al. |
| 2002/0070773 A1* | 6/2002 | Frey .................. F02D 41/221 327/108 |
| 2005/0212526 A1* | 9/2005 | Blades ................. G01R 31/67 324/543 |
| 2008/0106268 A1* | 5/2008 | Lewinski ............. H02H 3/162 324/509 |
| 2008/0106269 A1* | 5/2008 | Lewinski ............. G01R 31/50 324/509 |
| 2013/0049765 A1 | 2/2013 | Cheung et al. |

* cited by examiner

OPEN LOAD DIAGNOSIS

FIELD OF THE INVENTION

The present invention relates to open load diagnosis of a signal line.

BACKGROUND

Fault diagnosis is becoming increasingly important for integrated circuits (ICs), including mixed-signal application-specific integrated circuits (ASICs) and application-specific standard product (ASSPs). This is because electronic systems are increasingly being introduced into motor vehicles and industrial plant, and these systems are usually subject to functional safety requirements. One such requirement is the need for reliable detection of external load conditions.

A motor vehicle or industrial system may include one or more communication networks, such as, for example FlexRay®, Controller Area Network (CAN) and Ethernet. However, such systems can include simpler, single-wire communication or control networks. For example, a single wire control system may be used to allow a engine control unit (ECU) to an ignition IGBT driver.

Several arrangements for carrying open load diagnosis for a signal-wire communication system are known.

US 2002/0070773 A1 describes a driver switching stage which can carry out open-load diagnosis.

SUMMARY

According to a first aspect of the present invention there is provided a device for open load diagnosis of a signal line in a system (e.g. a digital system) in which a logic state is represented by a band of voltages lying between first and second voltage limits, the device configured to cause the signal line to reach a first, stable voltage lying in the band, to apply a second, different voltage to the signal line lying in the band and without leaving the band, to perform a time constant dependent measurement so as to determine a value of a parameter which is or depends on resistance of a load between the signal line and a reference line, to compare the value of the parameter with a reference value of the parameter and, in dependence on comparison, to signal the result.

Thus, the device can be used to carry out open load diagnosis while the signal line is being used.

The first voltage limit may be 0V or substantially 0V (e.g. no more than 0.1 V) and/or the second voltage limit may be no more than 0.16 times or no more than 0.2 times a logic power supply voltage of the digital system. For example, the supply voltage may be 5 V and so the second voltage limit may be no more than 800 mV or no more than 1 V. The second voltage limit may be equal to or greater than 800 mV and/or equal to or less than 1 V.

The first voltage limit may be a logic power supply voltage of the digital system and/or the second voltage limit at least 0.8 times the supply voltage. For example, the supply voltage may be 5 V and so the first voltage level may be 5 V and the second voltage limit may at least 4 V.

To perform a time constant dependent measurement, the device may be configured to allow or to cause voltage of the signal line to decay from the second voltage towards the first voltage. To perform a time constant dependent measurement, the device may be configured to allow or to cause voltage of the signal line to rise from the first voltage towards the second voltage.

The device may be configured to measure the voltage of the signal line after a fixed time from a time when the voltage starts to decay. The device may be configured to measure the time for the voltage of the signal line to reach a third voltage between the first and second voltages.

To perform a time constant dependent measurement, the device may be configured to allow or to cause voltage of the signal line to rise from the first voltage towards the second voltage.

The device may comprise a voltage reference for providing the second voltage, a comparator for comparing voltage of the signal line with the second voltage and a logic circuit for generating a signal signalling an open load condition.

The device may comprise a controller for generating control signals so as to cause the second voltage to be applied to the signal line. The controller may comprise control logic of a driver. The controller may be configured to cause, after the time constant dependent measurement has been performed, to the signal line to reach the first, stable voltage.

The difference between the first and second voltages may be no more than 2 V, no more than 1 V or no more than 0.5 V. The difference between the first and second voltages may be at least 0.1 V, at least 0.2 V or at least 0.4 V. For example, the second voltage may be a logic power supply voltage of the digital system minus 1V or 0.800 mV.

According to a second aspect of the present invention there is provided a module comprising a driver (e.g. a push-pull driver) coupled to an output terminal for driving the signal line when the line is connected to the output terminal and the device coupled to the output terminal.

According to a third aspect of the present invention there is provided an integrated circuit comprising the device or a module which includes the device.

The integrated circuit may be a microcontroller, a system on a chip or an application specific integrated circuit.

According to a fourth aspect of the present invention there is provided a control unit comprising the device or a module which includes the device, or an integrated circuit which includes the device. The control unit may be an engine control unit (ECU).

According to a fifth aspect of the present invention there is provided a system comprising a signal wire, the device a module including the device or an integrated circuit including the device or the control unit including the device, wherein the device is coupled to the signal wire, and a receiver module coupled to the signal wire having a logic state which is represented by the band of voltages lying between the first and second voltage limits.

According to a sixth aspect of the present invention there is provided a vehicle comprising the system. The vehicle may be a motor vehicle. The motor vehicle may be a motorcycle, an automobile (sometimes referred to as a "car"), a minibus, a bus, a truck or lorry. The motor vehicle may be powered by an internal combustion engine and/or one or more electric motors.

According to a seventh aspect of the present invention there is provided a method of open load diagnosis of a signal line in a digital system in which a logic state is represented by a band of voltages lying between first and second voltage limits. The method comprises causing or waiting for the signal line to reach a first stable voltage lying in the band, applying a second, different voltage to the signal line lying in the band and without leaving the band, performing a time constant dependent measurement so as to determine a value of a parameter which is or depends on resistance of a load between the signal line and a reference line, comparing the value of the parameter with a reference value of the parameter, and, in dependence on comparison, signalling a result.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
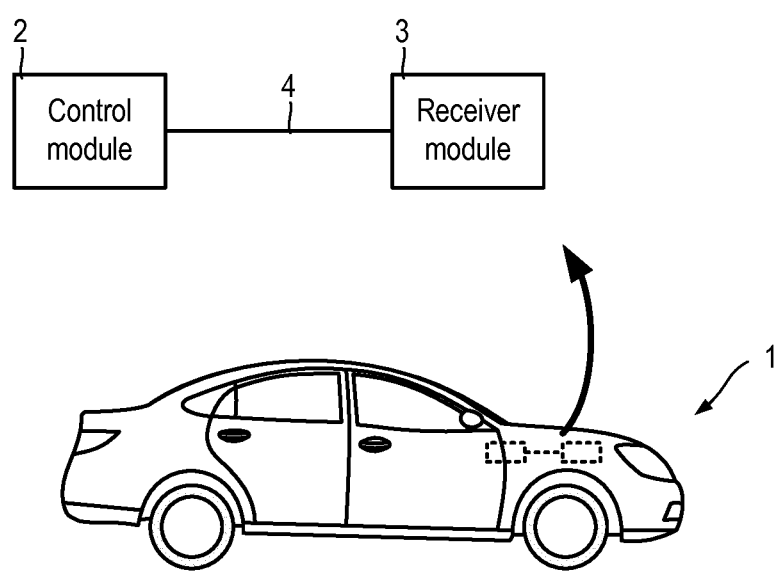
FIG. 1 illustrates a motor vehicle which includes a control module and a receiver module connected by a one-wire control bus.

In the following like parts are denoted by like reference numerals.

Motor Vehicle 1

Referring to FIG. 1, a motor vehicle 1 is shown which includes a control module 2 and a receiver module 3 connected by a signal line 4. The control module 2 may form part of an engine control unit (ECU) (not shown) and the receiver module 3 may take the form of an ignition coil driver.

Control & Receiver Modules 2, 3

Figure 2:
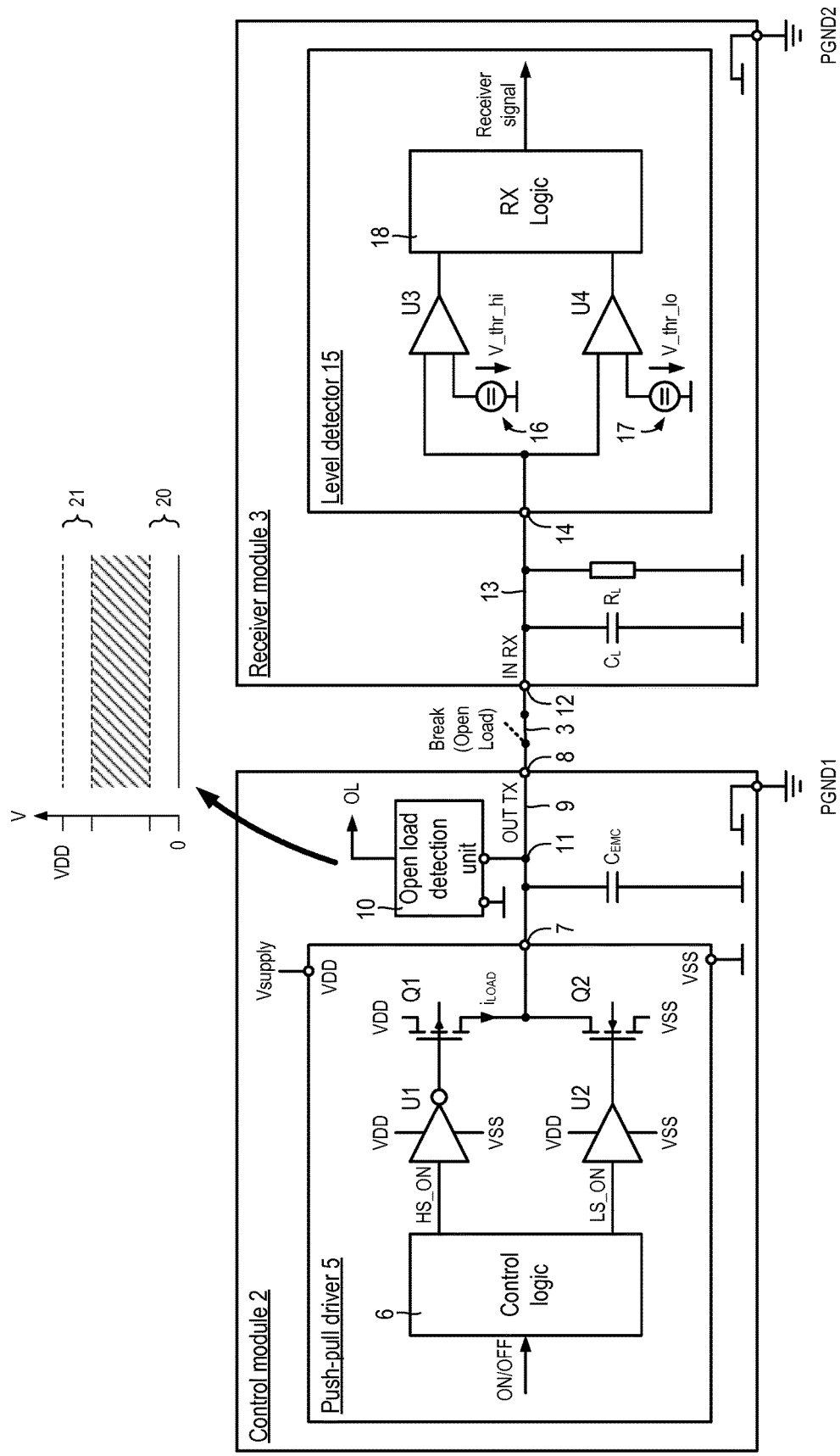
FIG. 2 is a block diagram of a control module which includes a signal wire driver and an open load diagnosis detector, and a receiver module.

Referring to FIG. 2, the control and receiver modules 2, 3 are shown in more detail. The control module 2 includes a push-pull driver 5 comprising control logic 6 which generates a high-side switch control signal HS_ON and a low-side switch control signal LS_ON. The HS_ON and LS_ON signals are fed into an inverter U1 and a follower U2 respectively. The outputs of the inverter U1 and follower U2 are connected to respective gates of p-channel and n-channel MOSFETs Q1, Q2 which are arranged in series between positive supply rail VDD and negative supply rail VSS. The push-pull driver 5 is able to switch a driver output 7 between LOW and HIGH states.

The control module 2 has an output terminal 8 which is connected directly to the push-pull driver output 7 via line 9. The control module 2 includes an open load detector 10 which is connected to the line 9 between the output 7 of the push-pull driver 5 and the output terminal 8 of the module 2 at a node 11. In response to detecting an open-load condition, the detector 10 generates an open load signal OL. An electromagnetic compatibility filtering capacitor $C_{EMC}$ is placed between the line 9 and ground.

The receiver module 3 has an input 12 and a line 13 which is connected directly to an input 14 of a level detector 15. A load capacitor $C_L$ and a load resistance $R_L$ appear, in parallel, between the line 13 and ground.

The level detector 15 includes first and second voltage comparators U3, U4 coupled to respective first and second voltage references 16, 17 respectively which are set to V_th_lo and V_th_hi respectively. The values of V_th_lo and V_th_hi may be, for example, 0.3 V and 0.7 V respectively. The input 14 is split and coupled to a respective one of the inputs of the comparators U3, U4 so as to compare an input signal level IN RX against low and high voltage thresholds V_th_lo and V_th_hi. The outputs of the comparators U3, U4 are supplied to logic 18 so as to determine whether the signal is LOW and HIGH.

The ON/OFF status and timing of the receiver module 3 is controlled by the transmitter module 2. Timing (e.g. of rising and/or falling edges) may be used to control the receiver module 3, or a component or unit controlled by the module 3, such as an actuator or IGBT.

The open load detector 10 is arranged to carry out open load diagnosis to detect a break 19 (or other cause of an open load or high resistance) in the line 4.

The open load detector 10 uses the receiver input signal noise guard band 20, 21 for open diagnosis during signal LOW state or HIGH states.

First Open Load Detector 101

Figure 3:
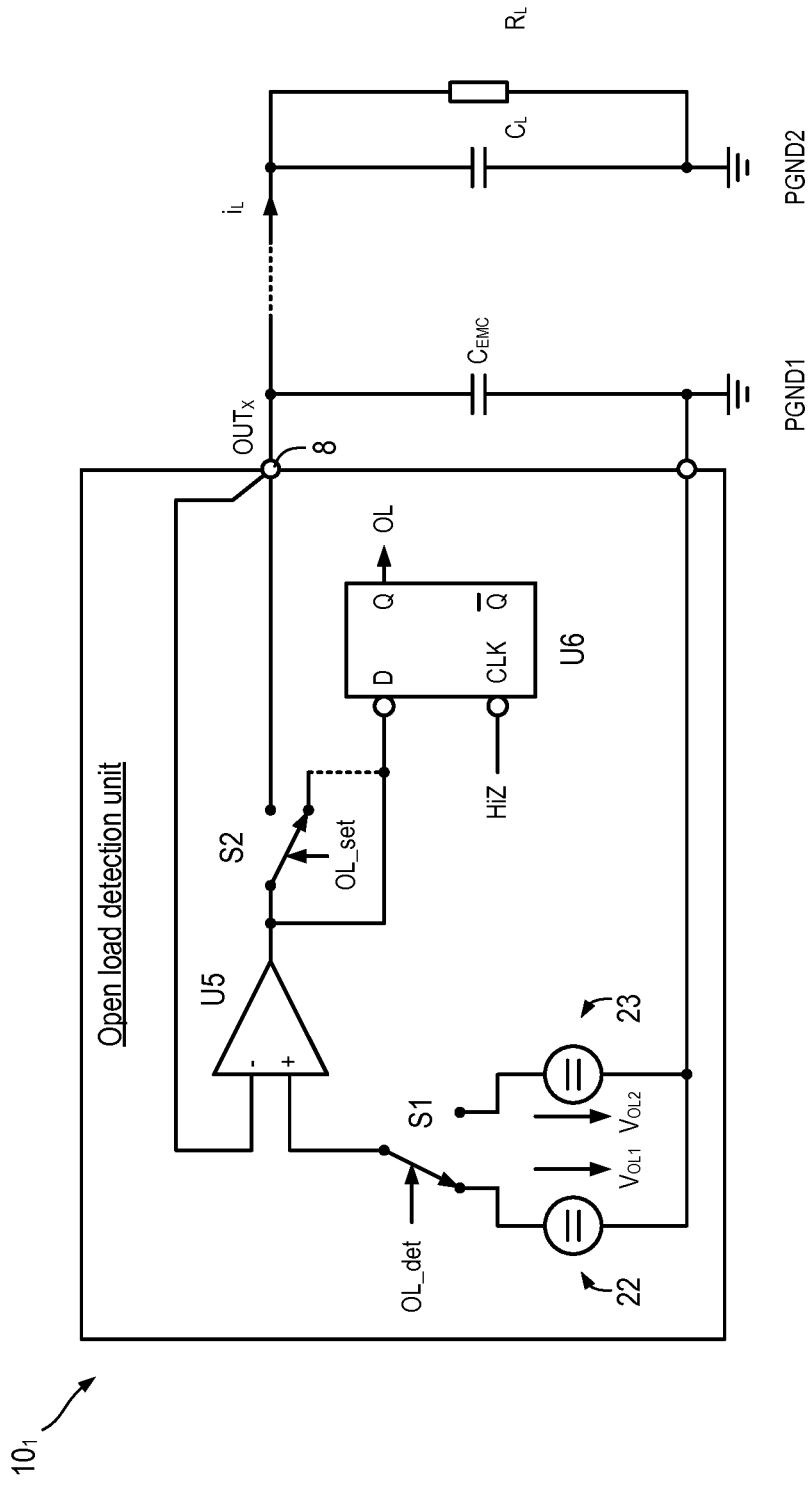
FIG. 3 illustrates a first open load diagnosis detector.
Figure 4:
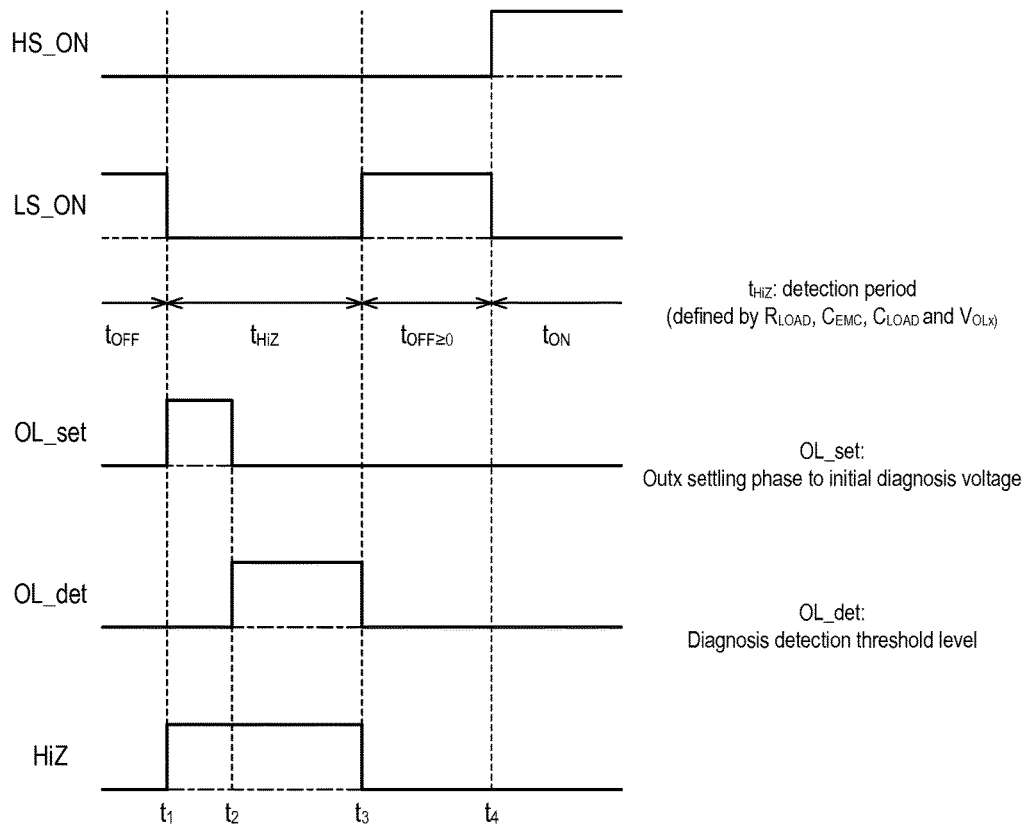
FIG. 4 is a timing chart illustrating operation of the first open load diagnosis detector shown in FIG. 3.
Figure 5:
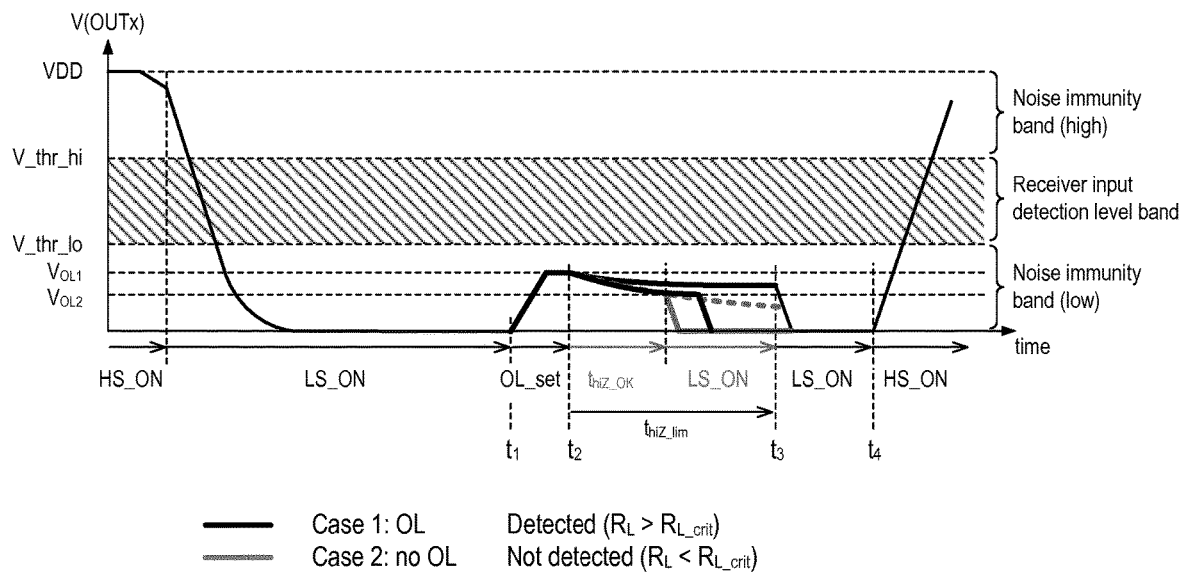
FIG. 5 illustrates variation in control signal output during open load diagnosis using the first open load diagnosis detector shown in FIG. 3.

Referring to FIG. 3, a first open load detector 101 is shown.

The first open load detector 101 includes a comparator U5 having a non-inverting input connectable, via a first single-pole, double-throw switch S1, which is controllable by an open load detect signal OL_det generated by control logic 6, to first and second voltage references 22, 23 providing reference voltages $V_{OL1}$ and $V_{OL2}$ respectively. The inverting input of the comparator U5 is connected to the module output 8. The output of the comparator U5 is connectable, via a second single-pole, double-throw switch S2, which is controllable by an open load set signal OL_set generated by control logic 6, to the output 8 of the control module 2 and to the D input of a D-type flip-flop U6. The CLK input of the D-type flip-flop U6 is connected to a detection signal HiZ generated by control logic 6. The Q output of the D-type flip-flop U6, when HIGH, is used to signal an open-load state OL. The OL detection timing can be implemented by the control logic 6 or by the open load detector 101.

During OL_set, the buffer U5 operates as a unity gain amplifier setting the module output 8 to V_OL1 between time t1 and time t2. Starting OL_det, the buffer U5 acts as a (non-feedback) comparator having the same offset as for setting V_OL1 and its output is latched by the D-type flip-flop U6 at time t3 while V_OL2 applies a new, lower reference. Thus, after t3 has elapsed, the external impedance at OUTx defines whether or not there is an open-load state OL.

Referring to FIGS. 2 to 5, open load detection using the first open load detector 101 will now be described.

It is assumed that load impedance in the receiver module 3 is tied to PGND. Diagnosis is carried out in the low level noise guard band 20. During a detection phase, the control signal OUTx is raised to a non-critical level, namely an initial diagnosis voltage $V_{OL1}$, which is not high enough to trigger the low level threshold of the receiver.

If the RC time constant is high due to there being an open load, then the decay time t to (or towards) a second diagnosis level $V_{OL2}$ will be slower can be used to judge if there is connection. The presence of a low or high impendence can be determined by waiting a predetermined time and checking the status of the comparator U5 after the predetermined time has elapsed and/or by measuring the time until OUTx drops below the second diagnosis level $V_{OL2}$.

Open load diagnosis is carried out after the OUTx has been LOW for a sufficiently long time so as to have settled.

At time $t_1$, the logic control 6 switches LS_ON from HIGH to LOW, the detection signal HiZ and OL_set from LOW to HIGH. As a result, OUTx rises and settles at the initial diagnosis voltage $V_{OL1}$, which is below $V_{th\_lo}$.

At time t2, the logic control 6 switches OL_set from HIGH to LOW and OL_det from LOW to HIGH thereby switching connecting the non-inventing input to the second diagnosis level $V_{OL2}$. The rate of change in OUTx depends on the RC time constant which depends on whether there is relatively low-impedance load (i.e. $R_L$) or a high-impedance load. A critical load resistance $R_{L\_crit}$ can be set such that, if load resistance exceeds the critical load resistance $R_{L\_crit}$, then the open load condition is deemed to be present.

At time t3, the logic control 6 switches OL_det and HiZ from HIGH to LOW which triggers readout of OL. Also, the logic control 6 switches LS_ON from LOW to HIGH so as to start to drive OUTx to a LOW state.

Second Open Load Detector 10₂

Figure 6:
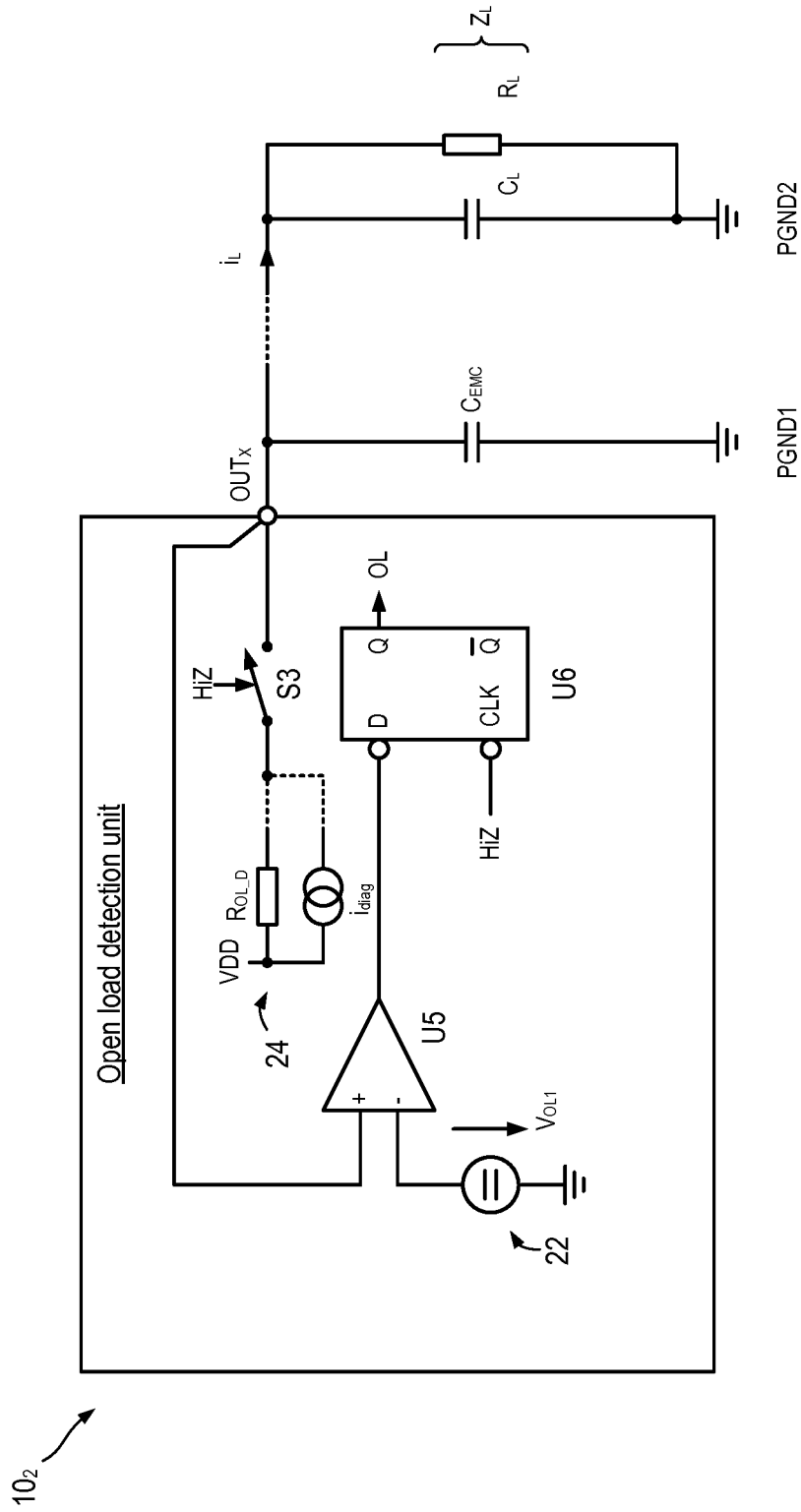
FIG. 6 illustrates a second open load diagnosis detector.
Figure 7:
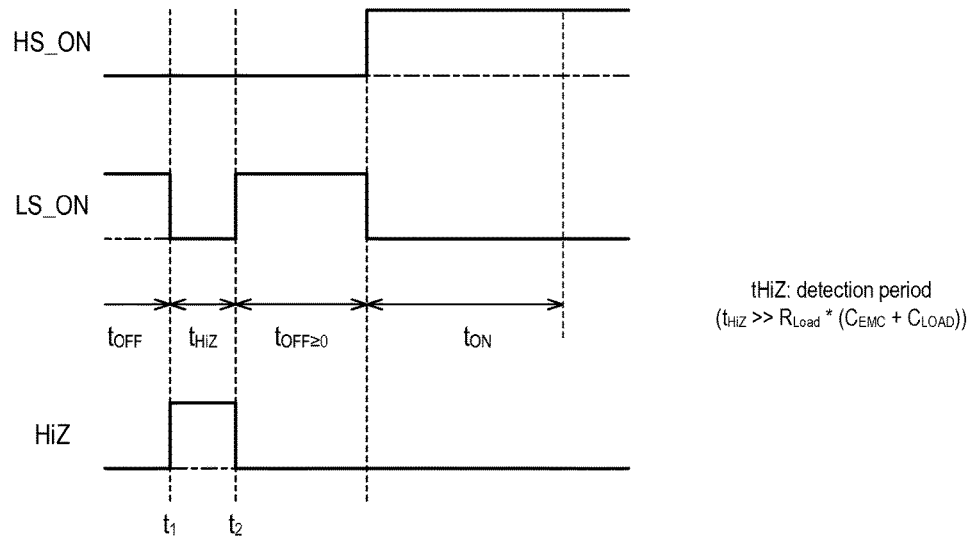
FIG. 7 is a timing chart illustrating operation of the second open load diagnosis detector shown in FIG. 6.
Figure 8:
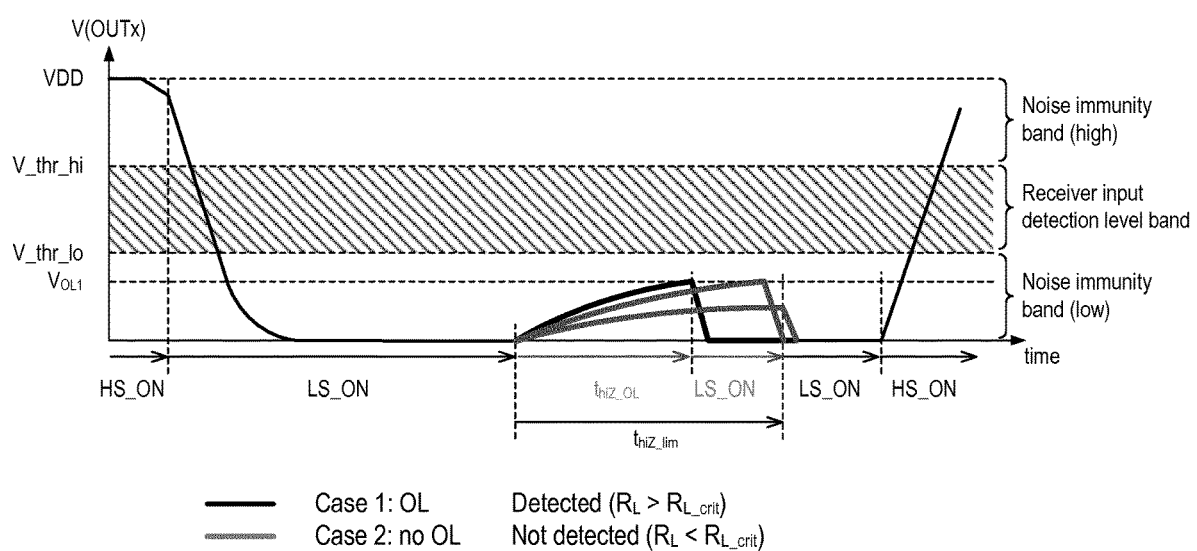
FIG. 8 illustrates variation in control signal output during open load diagnosis using the second open load diagnosis detector shown in FIG. 6.
Figure 9:
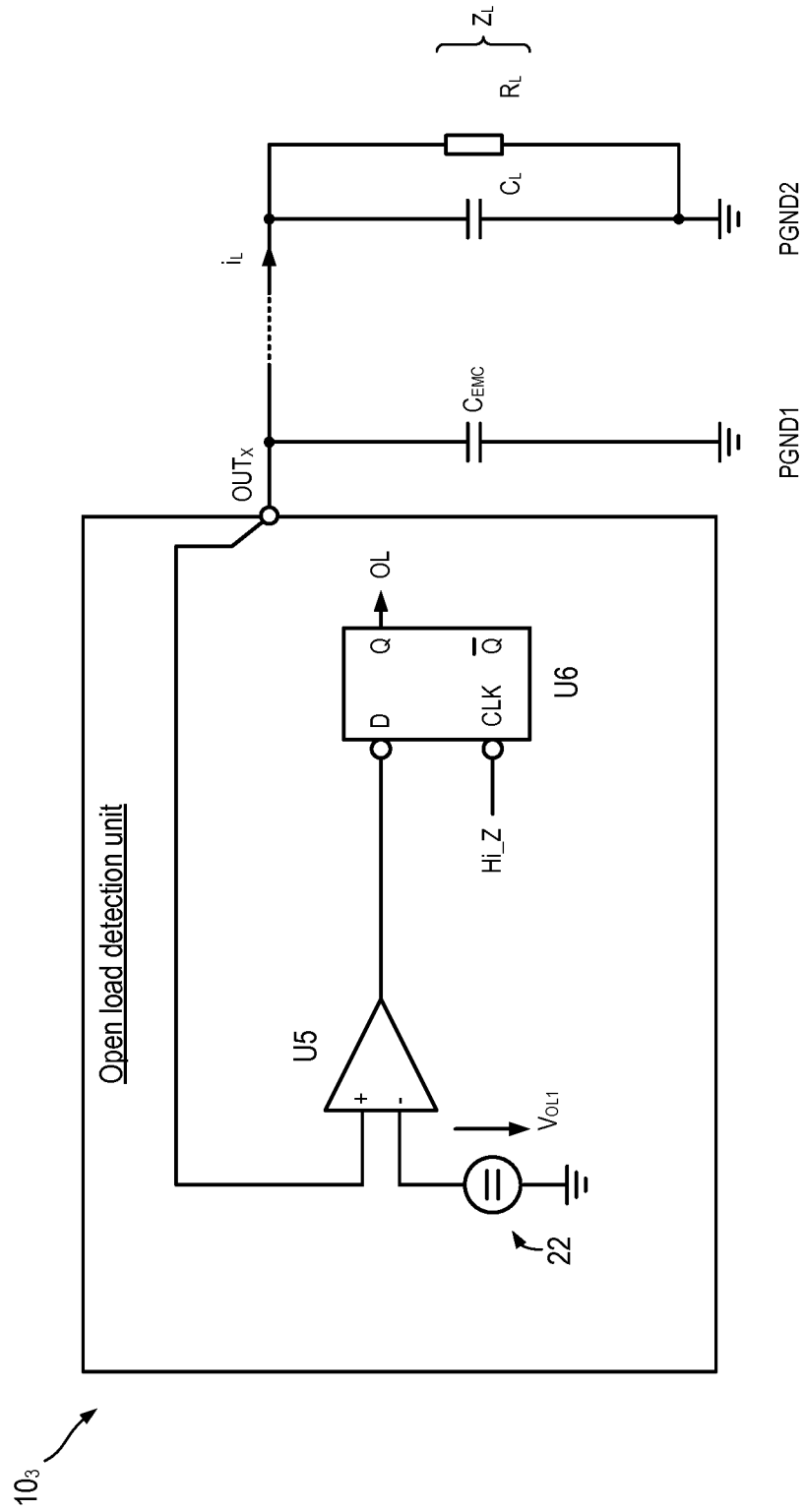
FIG. 9 illustrates a third open load diagnosis detector.
Figure 10:
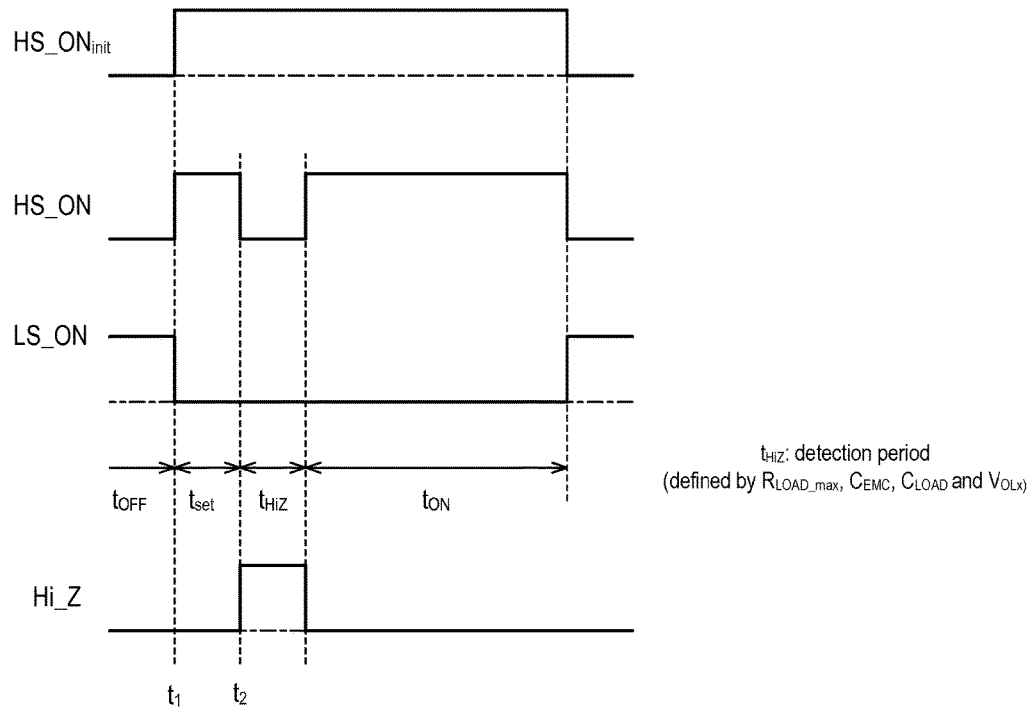
FIG. 10 s a timing chart illustrating operation of the third open load diagnosis detector shown in FIG. 6.
Figure 11:
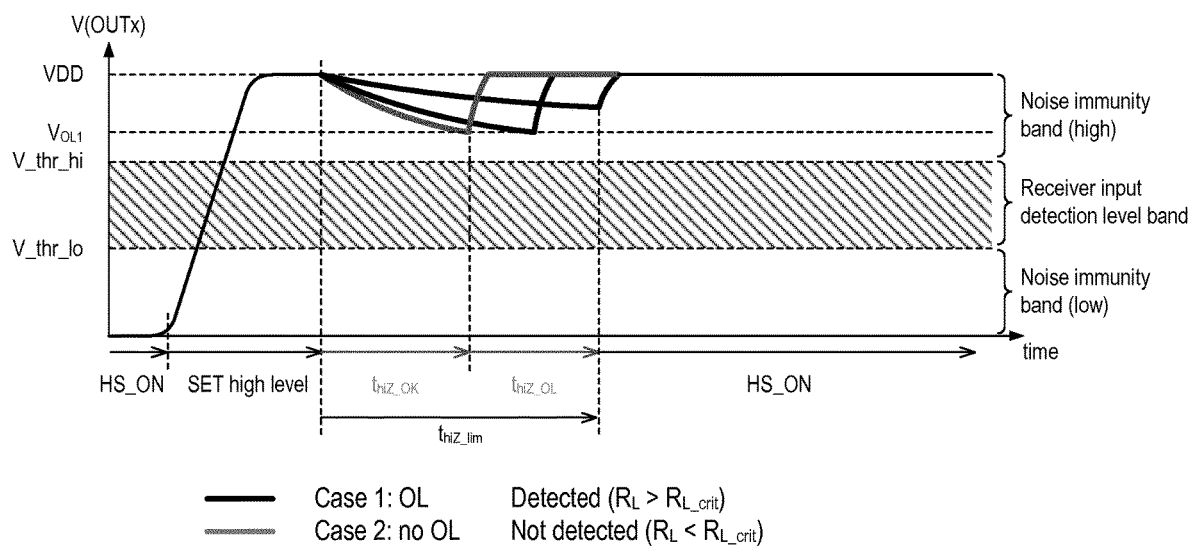
FIG. 11 illustrates variation in control signal output during open load diagnosis using the third open load diagnosis detector shown in FIG. 6.

Referring to FIG. 6, a second open load detector 10₂ is shown.

The second open load detector 10₂ is the same as the first open load detector 101 except that rather than charge up the capacitor $C_{EMC}$ and measure the time it takes to the capacitor $C_{EMC}$ discharge to a given level and/or OUTx to fall below a threshold, it measures the time it takes to charge the capacitor $C_{EMC}$ to a given level and/or for the OUTx to rise above a threshold.

In the second open load detector 10₂ the non-inverting input is connected to the first voltage reference 22 providing reference voltages $V_{OL1}$ and the second voltage reference 23 providing the second reference voltage $V_{OL2}$ is omitted. The output of the comparator US is connected to the D input of a D-type flip-flop U6.

The second open load detector 10₂ includes a charging circuit 24, which includes a current source 25 driving a current $i_{diag}$ and a resistor $R_{OL\_D}$ in parallel, connected via a single pole, single-throw switch S3 to the module output 8.

Referring to FIGS. 2 and 6 to 8, rather waiting for OUTx to fall, the second open load detector 10₂ waits for OUTx either to reach $V_{OL1}$ or to wait a predetermined time and measure OUTx.

Third Open Load Detector 10₃

Referring to FIG. 6, a third open load detector 10₃ is shown.

Referring also to FIGS. 2, 3 and 6, the two detectors 10₂, 10₃ hereinbefore described operate in the low noise immunity band 20. The third open load detector 10₃ is configured to operate in the high noise immunity band 21.

Starting from a settled HIGH level at output OUTx, the third open load detector 10₃ allows a ramp down in OUTx. The third open load detector 10₃ measures the time it takes to the capacitor $C_{EMC}$ discharge to given level and/or OUTx to fall below a threshold.

The third open load detector 10₃ is the same as the second open load detector 10₂ except that the charging circuit 24 is omitted.

Modifications

It will be appreciated that many modifications may be made to the embodiments herein before described. Such modifications may involve equivalent and other features which are already known in the design, manufacture and use of microcontrollers, communication buses or drivers, or parts thereof and which may be used instead of or in addition to features already described herein. Features of one embodiment may be replaced or supplemented by features of another embodiment.

For example, the approach can be used on multiple signal lines, e.g. by providing an open load detector for each of a plurality of lines or by using fewer, for instance, one detector and a multiplexer.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. A device for open load diagnosis of a signal line in a system in which a logic state is represented by a band of voltages lying between first and second voltage limits, the device configured to cause the signal line to reach a first, stable voltage lying in the band, to apply a second, different voltage to the signal line lying in the band and without leaving the band, to perform a time constant dependent measurement so as to determine a value of a parameter which is or depends on resistance of a load between the signal line and a reference line, to compare the value of the parameter with a reference value of the parameter and, in dependence on comparison, to signal the result.

2. A device according to claim 1, wherein the first voltage limit is 0V and the second voltage limit is no more than 0.16 times or no more than 0.2 times a logic power supply voltage of the digital system.

3. A device according to claim 1, wherein the first voltage limit is a logic power supply voltage of the digital system and the second voltage limit at least 0.8 times the supply voltage.

4. A device according to claim 1, wherein, to perform a time constant dependent measurement, the device is configured to allow or to cause voltage of the signal line to decay from the second voltage towards the first voltage.

5. A device according to claim 1, wherein, to perform a time constant dependent measurement, the device is configured to allow or to cause voltage of the signal line to rise from the first voltage towards the second voltage.

6. A device according to claim 4, wherein the device is configured to measure the voltage of the signal line after a fixed time from a time when the voltage starts to decay.

7. A device according to claim 4, wherein the device is configured to time for the voltage of the signal line to reach a third voltage between the first and second voltages.

8. A device according to claim 4, wherein, to perform a time constant dependent measurement, the device is configured to allow or to cause voltage of the signal line to rise from the first voltage towards the second voltage.

9. A device according to claim 1, wherein the device comprises:
 a voltage reference for providing the second voltage;
 a comparator for comparing voltage of the signal line with the second voltage; and a logic circuit for generating a signal signalling an open load condition.

10. A device according to according to claim 1, wherein the device comprises:
a controller for generating control signals so as to cause the second voltage to be applied to the signal line.

11. A device according to according to claim 10, wherein the controller is configured to cause, after the time constant dependent measurement has been performed, to the signal line to reach the first, stable voltage.

12. A module comprising:
a push-pull driver coupled to an output terminal for driving the signal line when connected to the output terminal; and
a device according to claim 1 coupled to the output terminal.

13. The module of claim 12, further comprising an integrated circuit.

14. An integrated circuit according to claim 13, which is a microcontroller, a system on a chip or an application specific integrated circuit.

15. A control unit comprising:
a device for open load diagnosis of a signal line in a system in which a logic state is represented by a band of voltages lying between first and second limits, the device being configured to cause the signal line to reach a first, stable voltage lying in the band, to apply a second, different voltage to the signal line lying in the band and without leaving the band, to perform a time constant dependent measurement so as to determine a value of a parameter which is or depends on resistance of a load between the signal line and a reference line, to compare the value of the parameter with a reference value of the parameter and, in dependence on the comparison, to signal a result, wherein the device is coupled to the signal wire.

16. A system comprising:
a signal wire;
a device for open load diagnosis of a signal line in a system in which a logic state is represented by a band of voltages lying between first and second voltage limits, the device configured to cause the signal line to reach a first, stable voltage lying in the band, to apply a second, different voltage to the signal line lying in the band and without leaving the band, to perform a time constant dependent measurement so as to determine a value of a parameter which is or depends on resistance of a load between the signal line and a reference line, to compare the value of the parameter with a reference value of the parameter and, in dependence on comparison, to signal the result, wherein the device is coupled to the signal wire,
a receiver module coupled to the signal wire having a logic state which is represented by the band of voltages lying between the first and second voltage limits.

17. A vehicle comprising a system according to claim 16.

18. A method of open load diagnosis of a signal line in a digital system in which a logic state is represented by a band of voltages lying between first and second voltage limits, the method comprising:
causing or waiting for the signal line to reach a first stable voltage lying in the band;
applying a second, different voltage to the signal line lying in the band and without leaving the band;
performing a time constant dependent measurement so as to determine a value of a parameter which is or depends on resistance of a load between the signal line and a reference line;
comparing the value of the parameter with a reference value of the parameter; and
in dependence on comparison, signalling a result.

* * * * *